United States Patent [19]

Suzuki et al.

[11] Patent Number: 4,916,670

[45] Date of Patent: Apr. 10, 1990

[54] SEMICONDUCTOR MEMORY DEVICE HAVING FUNCTION OF GENERATING WRITE SIGNAL INTERNALLY

[75] Inventors: Atsushi Suzuki, Kawasaki; Kazuya Kobayashi, Tokyo, both of Japan

[73] Assignee: Fujitsu Limited, Kawasaki, Japan

[21] Appl. No.: 304,318

[22] Filed: Jan. 31, 1989

[30] Foreign Application Priority Data

Feb. 2, 1988 [JP] Japan .................................. 63-021161
Mar. 11, 1988 [JP] Japan .................................. 63-056311
Mar. 11, 1988 [JP] Japan .................................. 63-056314

[51] Int. Cl.⁴ .............................................. G11C 13/00
[52] U.S. Cl. ................................ 365/233; 365/189.01
[58] Field of Search ............. 365/233, 189.01, 189.04, 365/230.06, 230.08

[56] References Cited

U.S. PATENT DOCUMENTS 4,773,049 9/1988 Takemae ........................ 365/189.01

Primary Examiner—Terrell W. Fears
Attorney, Agent, or Firm—Staas & Halsey

[57] ABSTRACT

A semiconductor memory device includes: a circuit for defining a cycle in response to a clock and a write enable signal and outputting a write control signal under a specific condition; a unit for inverting the clock to an inverted clock; a circuit for generating a write signal in response to the inverted clock when the write control signal is output; and a memory cell array in which a write access of data is carried out based on the write signal. Where a latch circuit is further provided which latches the write data and transmits the write data to the memory cell array in response to the clock or inverted clock and the write signal, an input terminal and an output terminal can be made common by making a latch timing of the write data different from that of the write enable signal, or the number of input terminals can be decreased by inputting the write data in a time sharing mode. This results in a decrease in scale of the whole circuit as a device. Also, by latching the write enable signal at a change in level of the clock and controlling a generation of the write signal or a prohibition of the generation at a reverse change in level thereof based on a control signal, a write operation can be cancelled, when necessary, with respect to a cell even if an address access to the cell is carried out.

22 Claims, 13 Drawing Sheets

Fig. 8a CLOCK CLK
Fig. 8b INVERTED CLOCK $\overline{CLK}$
Fig. 8c SIGNAL S1
Fig. 8d SIGNAL S2
Fig. 8e WRITE ENABLE SIGNAL $\overline{WE}$
Fig. 8f WRITE CONTROL SIGNAL WS
Fig. 8g WRITE PULSE WP
Fig. 8h IN./OUT. DATA $D_{IN}/D_{out}$

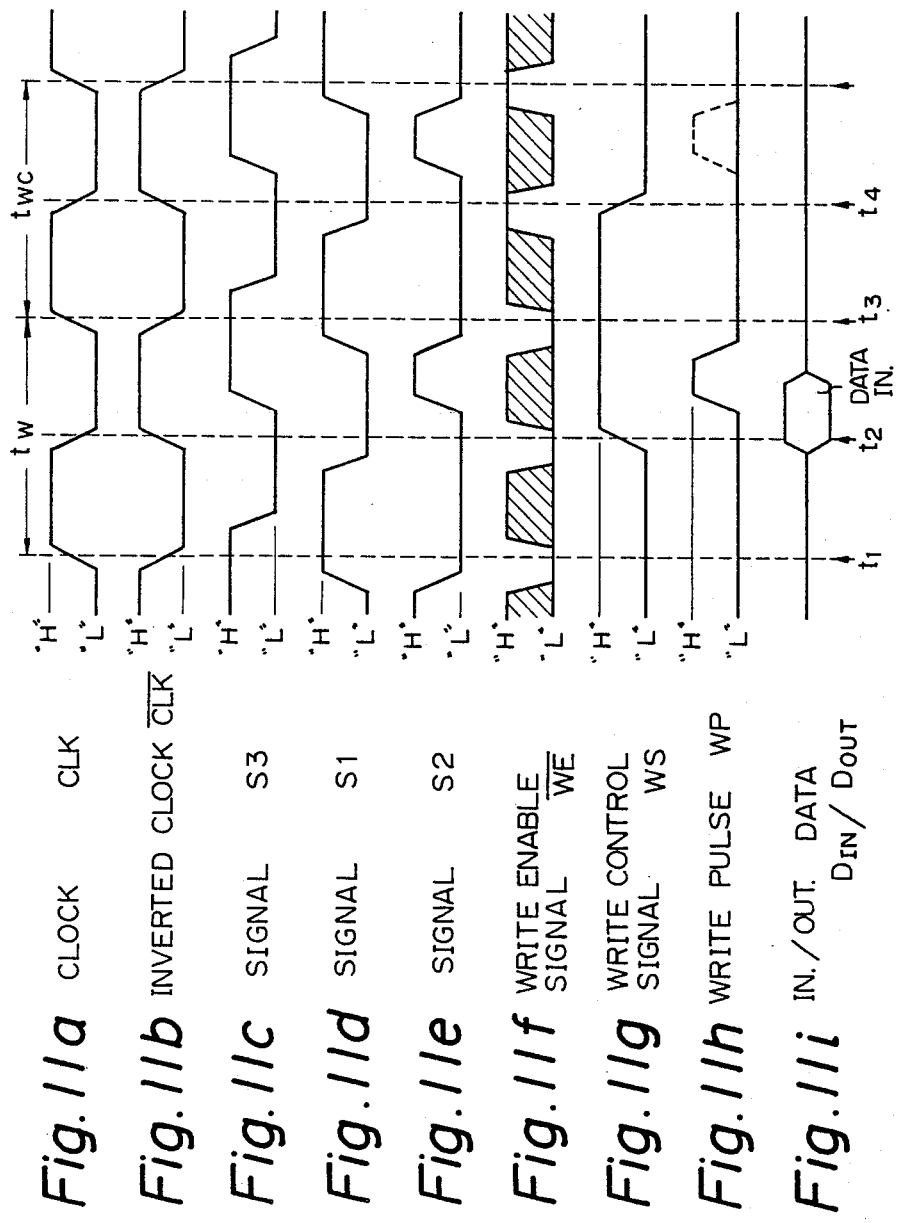

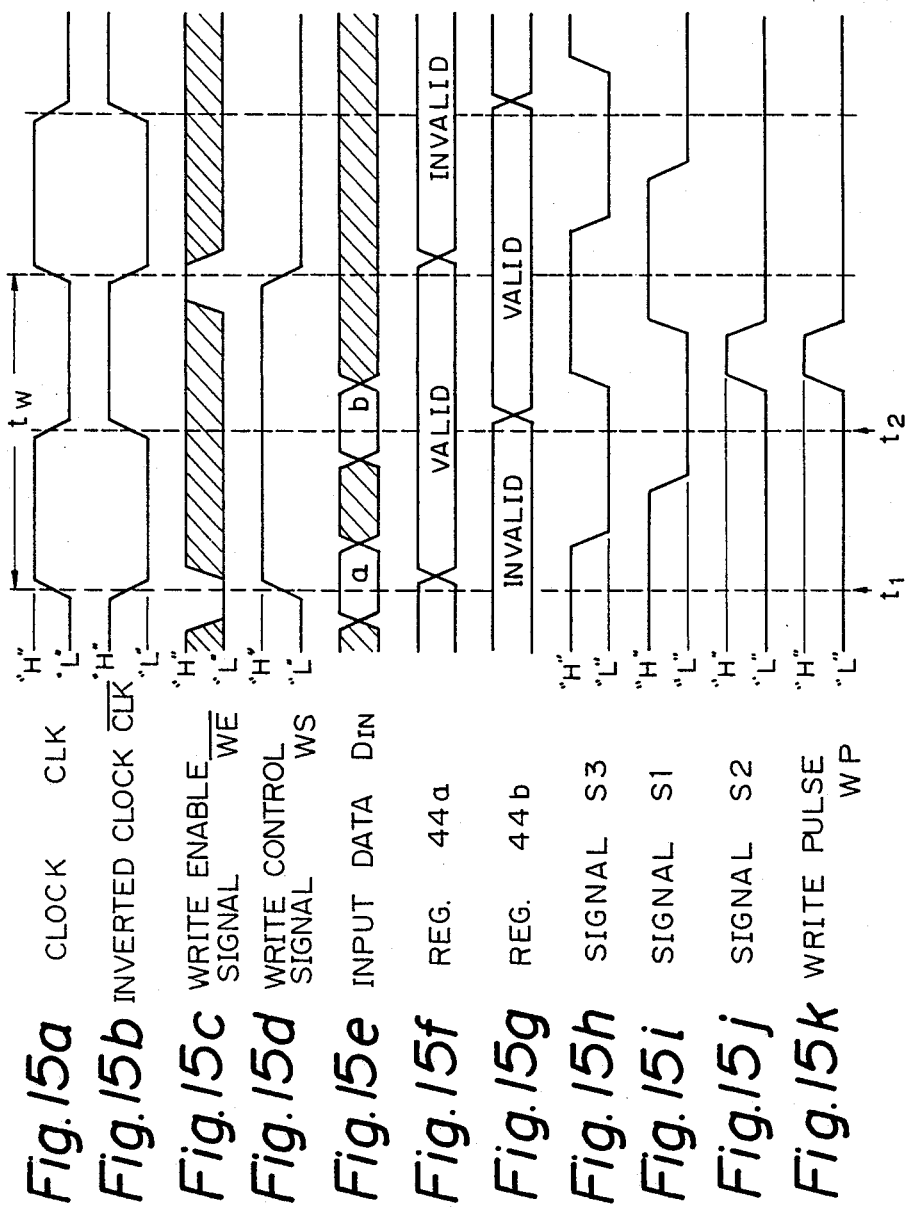

SEMICONDUCTOR MEMORY DEVICE HAVING FUNCTION OF GENERATING WRITE SIGNAL INTERNALLY

BACKGROUND OF THE INVENTION

1. Field of the Invention

The present invention relates to a semiconductor memory device and, more particularly, to a self-timed random access memory (STRAM) device in the form of a chip, having a function of generating a write signal (pulse) within the chip in response to an external clock and an external write enable signal.

A conventional static RAM (SRAM) carries out a write operation of data in response to an external write signal (pulse) with respect to a memory cell selected by an external address data. In this case, since both the address data and the write pulse are asynchronously applied to the SRAM, a timing of the application of the write pulse must be regulated outside the memory (chip) in a write-in of data. In practice, however, it is relatively difficult to regulate the application timing externally. Accordingly, measures are generally taken to give some time margin to the application timing. Thus, the SRAM poses a when high-speed operation is demanded. To cope with this, the above STRAM device has been developed.

2. Description of the Related Art

A typical STRAM device in the form of a chip automatically defines a cycle for carrying out a predetermined function, e.g., a read cycle, a write cycle or the like, in the chip in response to an external clock and an external write enable signal. For example, assuming that the read cycle and the write cycle are alternately defined at every rise of the clock, data which has been read is output in the former cycle and data to be written in is input in the latter cycle. In this case, the data output must be completed by the end of the read cycle. In practical operation, however, data is still being output even at the rise of the clock in the next cycle, i.e., write cycle, due to small delay in the read operation. On the other hand, when the write cycle begins at the rise of the clock, the write data is taken into the chip. Namely, both the "data output" and "data input" states are present at the same time. Therefore, the above conventional STRAM device must have a data input path (input terminal) and a data output path (output terminal) which are separate from each other.

On the other hand, it is known that, in an ordinary semiconductor device in the form of a chip, the space occupied by a terminal or terminals on the chip is extremely large compared with that occupied by other integrated circuit portions on the chip. This means that, the more the terminals are increased in number, the larger the whole circuit becomes in scale. Accordingly, the above STRAM device having both an input terminal and an output terminal is not suitable due to its large size.

Also, the above STRAM device generates a write pulse within the chip in response to the rise of the clock indicating a beginning of the write cycle. In this case, the write data supplied to in the chip and latched therein at the rise of the clock, is written in a memory cell selected based on external address data supplied to the chip at the rise of the clock, when the write pulse is generated. Namely, the access of write data is carried out immediately after the write enable signal is latched in the chip at the rise of the clock.

Therefore, since the writing of data into a cell selected at the rise of the clock is carried out without fail, it becomes impossible to cancel the write operation halfway. This results in a disadvantage as follows. Assuming that the data write operation is carried out with respect to a memory cell of address A, address data corresponding to the address A is input into the memory device. In this case, a check of whether or not the input address data really indicates the address A, i.e., an address parity check, is carried out in the memory device. Naturally, since the parity check requires some time, the result of the check is output at a certain time after the rise of the clock. When the parity check result indicates correct data, no problem occurs. However, in a case, e.g., where the input address data indicates an address B, a problem occurs in that the input data is written in a wrong cell corresponding to the address B, because the write operation to the cell of address A is carried out at the rise of the clock.

Furthermore, since the input data is composed of several bits of data, the above STRAM device requires a plurality of data input terminals corresponding to the number of data bits. As a result, the space occupied on the chip by the input terminals becomes relatively large. This leads to an increase in the scale of the whole circuit device, and thus, is not preferable.

SUMMARY OF THE INVENTION

An object of the present invention is to provide a semiconductor memory device in which a data input terminal and a data output terminal can be made common to reduce the space occupied thereby on a chip, and accordingly, decrease the scale of the whole circuit device.

Another object of the present invention is to provide a semiconductor memory device which can cancel a write operation of data, when necessary, even if an address access to a cell has been carried out, and accordingly, can prevent a write access to a wrong cell from being carried out.

Still another object of the present invention is to provide a semiconductor memory device in which the number of data input terminals can be reduced to half to contribute to a decrease in size of the whole circuit as a device.

According to a fundamental aspect of the present invention, there is provided a semiconductor memory device receiving an external clock having a rising edge and a falling edge including: a memory cell array; a first latch circuit operatively connected to the memory cell array, for receiving a control signal designating one of a read cycle and a write cycle for the memory cell array, the first latch circuit latching the control signal in response to one of the rising edge and the falling edge of the external clock; a second latch circuit operatively connected to the memory cell array, for receiving a write data, the second latch circuit latching the write data in response to another of the rising edge and the falling edge of external clock; and a write signal generating circuit operatively connected to the memory cell array and the first latch circuit, for feeding a write signal to the memory cell array when the control signal latched in the first latch circuit designates the write cycle.

Also, according to one aspect of the present invention, there is provided a semiconductor memory device including: a cycle defining circuit for defining a read cycle and a write cycle in response to an external clock and an external write enable signal and outputting a read control signal or a write control signal based on a certain kind of defined cycle; means for inverting the clock to an inverted clock; a write signal generating circuit operatively connected to the cycle defining circuit, for generating a write signal in response to the inverted clock when the write control signal is output; a memory cell array in which a read access or write access of data is carried out based on the read control signal or the write signal; and a latch circuit operatively connected to the write signal generating circuit, for latching a write data and transmitting the write data to the memory cell array in response to the inverted clock and the write signal, whereby the write enable signal is latched at a change in level of the external clock in the write cycle and the write data is latched at a reverse change in level thereof.

Also, according to another aspect of the present invention, there is provided a semiconductor memory device including: a cycle defining circuit for defining a cycle for carrying out a predetermined function in response to an external clock and an external write enable signal and outputting a write control signal in response to an external control signal in the defined cycle; means for inverting the clock to an inverted clock; a write signal generating circuit operatively connected to the cycle defining circuit, for generating a write signal in response to the inverted clock when the write control signal is output; and a memory cell array in which a write access of data is carried out based on the write signal, whereby the write enable signal is latched at a change in level of the external clock in the defined cycle, and a control of a generation of the write signal or a prohibition of the generation is carried out at a reverse change in level of the external clock in accordance with a logical level of the external control signal.

Also, according to still another aspect of the present invention, there is provided a semiconductor memory device including: a cycle defining circuit for defining a cycle for carrying out a predetermined function in response to an external clock and an external write enable signal, and outputting a write control signal based on a logical level of the write enable signal at the beginning of the defined cycle; means for inverting the clock to an inverted clock; a write signal generating circuit operatively connected to the cycle defining circuit, for generating a write signal in response to the inverted clock when the write control signal is output; a memory cell array in which a write access of data is carried out based on the write signal; and a latch circuit operatively connected to the write signal generating circuit, for latching a write data in response to either the external clock or the inverted clock and transmitting the write data to the memory cell array in response to the write signal, the write data being composed of a plurality of data and input in a time sharing mode, whereby a first half of the plurality of data is latched at a change in level of the external clock in the defined cycle and a second half thereof is latched at a reverse change in level thereof, and the plurality of data are simultaneously written in the memory cell array.

BRIEF DESCRIPTION OF THE DRAWINGS

Other objects and features of the present invention will be described in detail hereinafter by way of preferred embodiments with reference to the accompanying drawings, in which;

FIGS. 11a to 11i are timing charts for explaining the operation of the device shown in FIG. 9;

FIGS. 15a to 15k are timing charts for explaining the operation of the device shown in FIG. 14.

DESCRIPTION OF THE PREFERRED EMBODIMENTS

For a better understanding of the preferred embodiments, the problems of the prior art will now be explained with reference to FIGS. 1 to 3.

Figure 1:
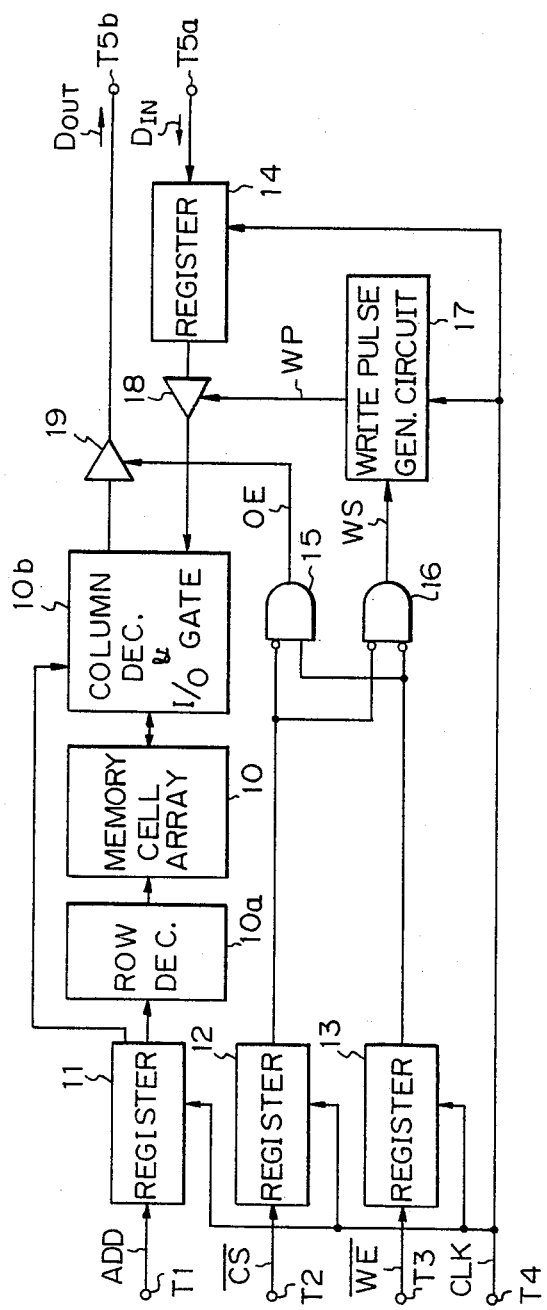
FIG. 1 is a block, diagram illustrating the constitution of an example of a prior art STRAM device.
Figure 2:
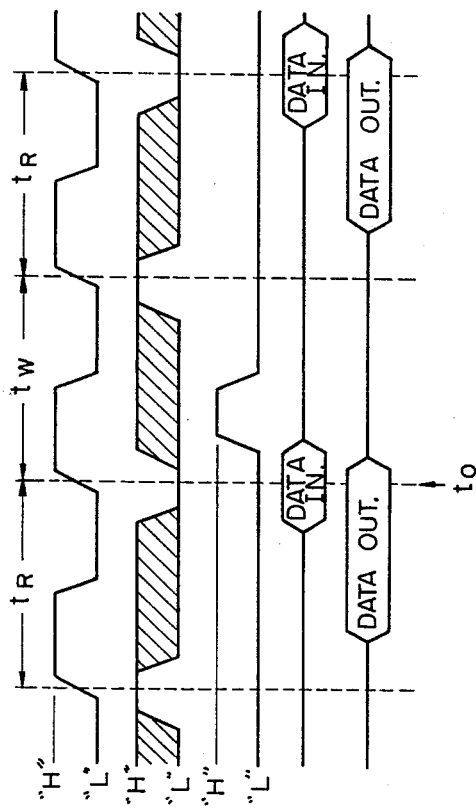
FIGS. 2a to 2e are timing charts for explaining the operation of the device shown in FIG. 1.

FIG. 1 shows the constitution of an example of the prior art STRAM device, and FIGS. 2a to 2e show timing charts representing the operation of the device.

In FIG. 1, reference 10 denotes an ordinary static type memory cell array having a memory cell provided at each intersection between a plurality of word lines (not shown) and a plurality of pairs of bit lines (not shown); reference 10a denotes a row decoder for selecting one of the word lines based on an address signal ADD; reference 10b denotes a column decoder and input/output (I/O) gate for selecting one of the pairs of bit lines based on the address signal and passing a read data $D_{OUT}$ or write data $D_{IN}$ therethrough; references 11, 12, 13 and 14 denote registers for latching the address signal ADD, a low active chip select signal $\overline{CS}$, a low active write enable signal $\overline{WE}$ and the write data $D_{IN}$, respectively, in response to an external clock CLK; reference 15 denotes an AND gate responding to an inverted signal of an output of the register 12 and an output of the register 13; reference 16 denotes an AND gate responding to the inverted signal of the output of the register 12 and an inverted signal of the output of the register 13; reference 17 denotes a circuit for generating a write pulse WP in response to the clock CLK when an output signal WS of the AND gate 16 is at "H"

level; reference 18 denotes a tristate buffer for passing the write data $D_{IN}$ therethrough in response to the write pulse WP; and reference 19 denotes a tristate buffer for passing the read data $D_{OUT}$ therethrough in response to a read control signal OE from the AND gate 15. Also, references T1, T2, T3, T4, and T5a denote terminals of a chip for inputting the address signal ADD, the chip select signal $\overline{CS}$, the write enable signal $\overline{WE}$, the clock CLK and the write data $D_{IN}$, respectively, and reference T5b denotes a terminal of the chip for outputting the read data $D_{OUT}$.

In the constitution shown in FIG. 1, when the chip select signal $\overline{CS}$ is changed to "L" level, and latched in the register 12 at a change in level of the external clock CLK (in the illustration of FIGS. 2a to 2e, at a rise of the clock), the STRAM device is brought to an active state. When the write enable signal $\overline{WE}$ is input together with the "L" level chip select signal $\overline{CS}$, the write enable signal $\overline{WE}$ of "H" level or "L" level is latched in the corresponding register 13 in synchronization with a change in level of the external clock CLK (in the illustration of FIGS. 2a to 2e, in synchronization with a rise of the clock). Concretely, when the write enable signal WE is at "H" level, the output signal OE of the AND gate 15 is at "H" level, so that the tristate buffer 19 functions and thus the read operation is carried out. Inversely, when the write enable signal $\overline{WE}$ is at "L" level, the output signal WS of the AND gate 16 is at "H" level, so that the write pulse WP is generated from the write pulse generating circuit 17. Accordingly, the tristate buffer 18 functions and thus the write operation is carried out.

Namely, a cycle for carrying out a predetermined function (in the illustration of FIGS. 2a to 2e, a read cycle $T_R$ and a write cycle $T_W$) is automatically defined in the chip in response to the clock CLK and the write enable signal $\overline{WE}$ at every cycle of the clock. Note, hatched portions in FIG. 2b indicate that the state is "indefinite".

According to the above prior art STRAM device, a signal indicating "a read inhibit", corresponding to the output signal OE of the AND gate 15 in the illustration of FIG. 1, is not yet output at the end of the read cycle $T_R$, i.e., at the rise of the clock CLK. In practical operation, the data output becomes invalid at a certain time after the rise of the clock due to a small delay in the circuit operation. As a result, as shown in FIG. 2e, the data output state still continues even at the rise of the clock CLK in the write cycle $t_W$, i.e., at a time of $t_0$. In this case, the data $D_{OUT}$ read from the memory cell array 10 is output via the column decoder and I/O gate 10b and the buffer 19 to the terminal T5b, and sent to the outside. At the time $t_0$, however, the write data $D_{IN}$ from the outside is taken in via the terminal T5a by the register 14.

According to the constitution of the device of FIG. 1, both the state of "data output" state and "data input" state are present at the rise of the clock CLK in the write cycle $t_W$, i.e., at the time of $t_0$. Therefore, assuming that a data input path (data input terminal T5a) and a data output path (data output terminal T5b) are made common a problem occurs in that the output data and the input data collide with each other. To cope with this, a constitution in which the data input terminal T5a and the data output terminal T5b are separated from each other must be adopted, as shown in FIG. 1.

As described before, however, since the space occupied by the data input terminal and the data output terminal on the chip becomes relatively large, and accordingly, the whole circuit device is increased in scale, this is not suitable. Therefore, it would be preferable that the input and output terminals are made common without causing a disadvantage in that read data and write data collide with each other.

Referring to FIGS. 2a to 2e, a write pulse WP is generated in response to the rise of the clock CLK indicating the beginning of the write cycle $t_W$. Accordingly, the input data $D_{IN}$ taken into the register 14 and latched therein at the rise of the clock CLK (at the time $t_0$) is written into a memory cell (not shown) selected based on the address signal ADD supplied to the register 11 at the time $t_0$, at the generation of the write pulse WP. Namely, the write access of data is carried out immediately after the write enable signal $\overline{WE}$ is latched in the register 13 at the time $t_0$.

Therefore, according to the above constitution, since the writing of data into the memory cell selected at the time $t_0$ is carried out without fail, it becomes impossible to cancel the write operation halfway through. This results in a disadvantage as explained before.

Namely, when the address signal ADD is input into the device at the time $t_0$, the parity check of whether or not the input address signal really indicates an address corresponding to a cell to be selected is carried in the device. The result of the check is output at a certain time after the time $t_0$ due to a delay in the parity check operation. Accordingly, where the parity check indicates an error, a problem occurs in that the input data is wrongly written in another cell different from the cell to be selected. Although the illustration of FIG. 1 shows a constitution having one input terminal and one corresponding output terminal for simplification of the explanation, the actual device has a plurality of input terminals and corresponding output terminals. An example of such a constitution is shown in FIG. 3.

Figure 3:
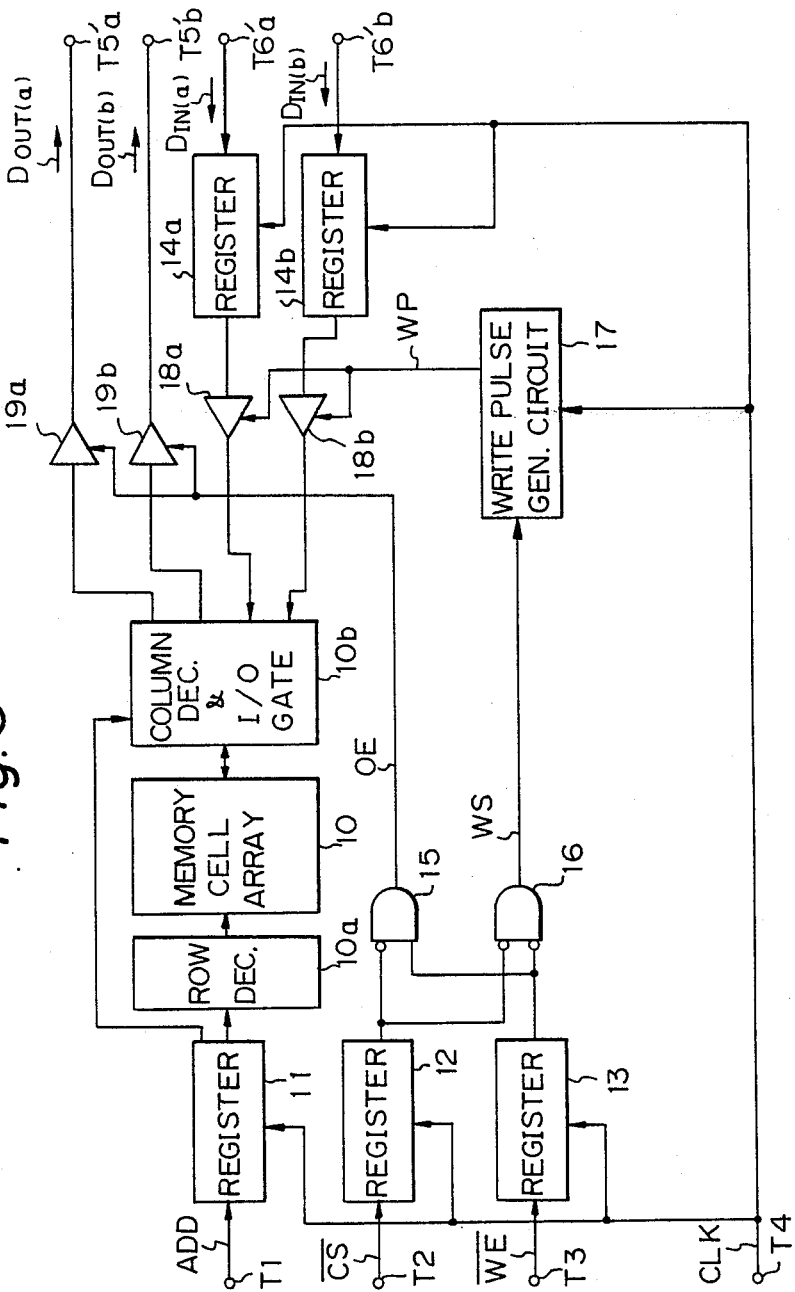
FIG. 3 is a block diagram illustrating the constitution of another example of a prior art STRAM device.

FIG. 3 shows a constitution having two input terminals and corresponding output terminals. Namely, the constitution of FIG. 3 is different from that of FIG. 1 in that, in place of the register 14, the input buffer 18, the output buffer 19, the input terminal T5a and the output terminal T5b, two registers 14a, 14b two input buffers 18a, 18b, two output buffers 19a, 19b, two input terminals T6a', T6b', and two output terminals T5a', T5b', are employed. The constitution and the operation of the remaining parts of the circuit are the same as those of FIG. 1, and thus, the explanation thereof will be omitted.

The constitution of FIG. 3 has a disadvantage as does that of FIG. 1 in that the space occupied by the input and output terminals on the chip becomes relatively large. Namely, since the scale of the whole circuit device is increased, it is unsuitable. Therefore, it would be preferable to decrease the number of terminals.

Preferred embodiments of the present invention will now be described in detail with reference to FIGS. 4 to 15k.

Figure 4:
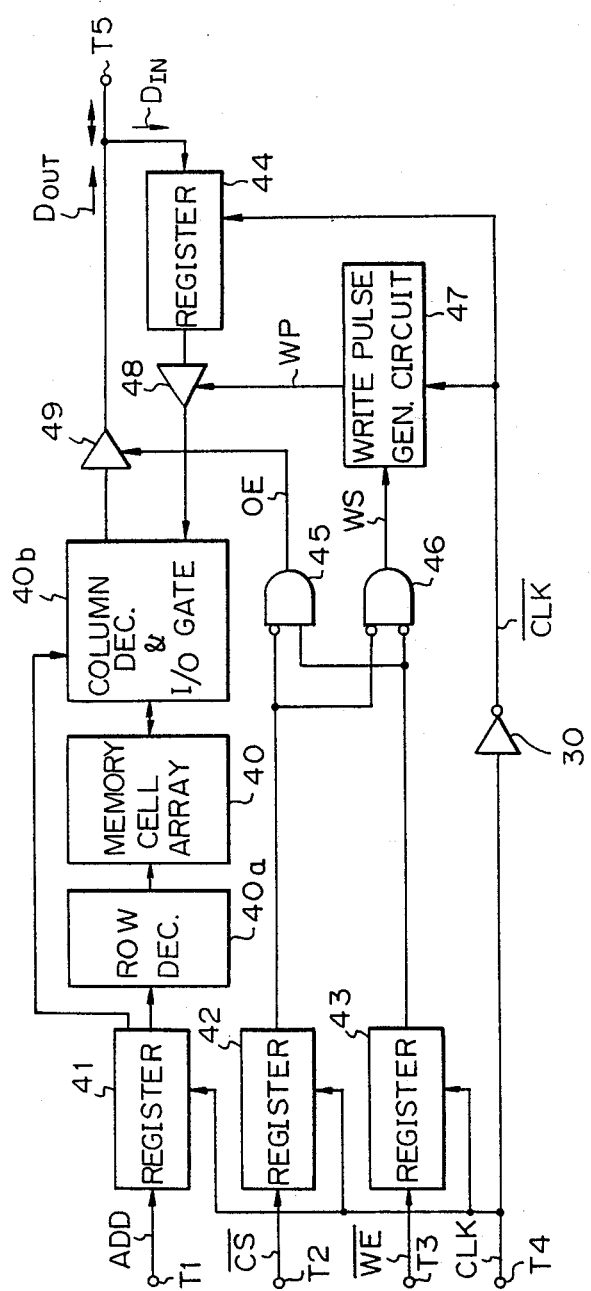
FIG. 4 is a block diagram illustrating the constitution of the STRAM device as a first embodiment of the present invention.

FIG. 4 illustrates the constitution of STRAM device as a first embodiment of the present invention.

In FIG. 4, references T1–T5 denote terminals of the chip; reference 40 denotes an ordinary static type memory cell array having a memory cell provided at each intersection between a plurality of word lines (not shown) and a plurality of pairs of bit lines (not shown); reference 40a denotes a row decoder for selecting one of the word lines based on an address signal ADD; reference 40b denotes a column decoder and input/output (I/O) gate for selecting one of the pairs of bit lines based on the address signal and passing a read data $D_{OUT}$ or write data $D_{IN}$ therethrough. The terminals T1–T4 receive the address signal ADD, a low active chip select signal $\overline{CS}$, a low active write enable signal $\overline{WE}$ and a clock CLK, respectively. Also, the terminal T5 is a common I/O terminal employed for both reading data from the memory cell array 40 (read data $D_{OUT}$) and a writing data thereinto (write data $D_{IN}$).

A register 41, connected between the terminal T1 and the row decoder 40a and column decoder and I/O gate 40b, has a function of latching the address signal ADD in response to the clock CLK. A register 42, connected between the terminal T2 and an AND gate 45, has a function of latching the chip select signal $\overline{CS}$ in response to the clock CLK.

Likewise, a register 43, connected between the terminal T3 and an AND gate 46, has a function of latching the write enable signal $\overline{WE}$ in response to the clock CLK.

Also, the portion between the I/O terminal T5 and the column decoder and I/O gate 40b is separated into two paths, i.e., a data write path and a data read path. The former includes a register 44 and a tristate buffer 48, and the latter includes a tristate buffer 49. An inverter 30, connected between the register 44 and the terminal T4, has a function of inverting the external clock CLK input from the terminal T4 and outputting an inverted clock $\overline{CLK}$. Accordingly, the register 44 latches the write data $D_{IN}$ in response to the inverted clock $\overline{CLK}$ and feeds the latched data to the tristate buffer 48. The tristate buffer 48 feeds the write data $D_{IN}$ transmitted via the register 44 to the column decoder and I/O gate 40b when a write pulse WP from a write pulse generating circuit 47 is at "H" level. Likewise, the tristate buffer 49 feeds the read data $D_{OUT}$ transmitted via the column decoder and I/O gate 40b to the I/O terminal T5 when a read control signal OE from the AND gate 45 is at "H" level.

The AND gate 45 responds to an inverted signal of an output of the register 42 and an output of the register 43 and outputs the read control signal OE, while the AND gate 46 responds to the inverted signal of the output of the register 42 and an inverted signal of the output of the register 43 and outputs a write control signal WS. The write pulse generating circuit 47 has a function of generating the write pulse WP in response to the rise edge of the inverted clock $\overline{CLK}$, i.e., the falling edge of the external clock CLK, when the write control signal WS is at "H" level.

Figure 5:
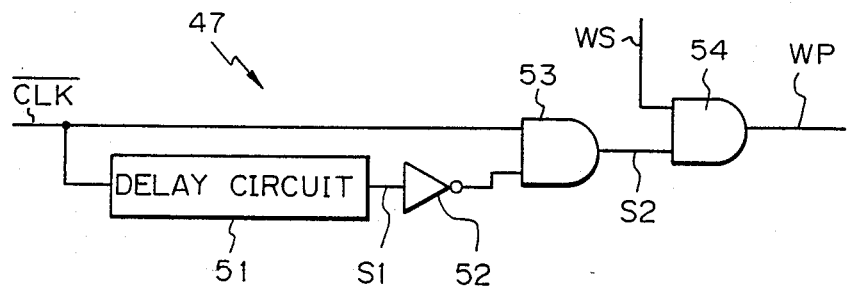
FIG. 5 is a circuit diagram illustrating the constitution of the write pulse generating circuit shown in FIG. 4.

Next, the constitution of the write pulse generating circuit 47 shown in FIG. 4 will be described with reference to FIG. 5.

The illustrated circuit 47 is constituted by a delay circuit 51 for delaying the inverted clock $\overline{CLK}$ by a predetermined time and outputting the delayed clock as a signal S1; an inverter 52 responding to the signal S1; an AND gate 53 responding to an output of the inverter 52 and the inverted clock $\overline{CLK}$ and outputting a signal S2; and an AND gate 54 responding to the signal S2 and the write control signal WS and outputting the write pulse WP. In the illustrated constitution, when the inverted clock $\overline{CLK}$ is made "H" level, the AND gate 53 is brought to the open state. Accordingly, when the write control signal WS is at "H" level, the signal S2 is output as the write pulse WP via the AND gate 54.

Next, the circuit constitution of the register shown in FIG. 4 will be explained with reference to FIG. 6.

The illustrated register is constituted by a transmission gate TG1 for transmitting an input signal IN in response to a pair of clocks CLK and $\overline{CLK}$; a CMOS inverter IV1 responding to an output of the gate TG1 and an output of a transmission gate TG2; a CMOS inverter IV2 responding to an output of the inverter IV1; the gate TG2 for transmitting an output of the inverter IV2 in response to a pair of clocks CLK and $\overline{CLK}$; a transmission gate TG3 for transmitting the output of the inverter IV1 in response to a pair of clocks CLK and $\overline{CLK}$; a CMOS inverter IV3 responding to an output of the gate TG3 and an output of a transmission gate TG4; a CMOS inverter IV4 responding to an output signal OUT of the inverter IV3; and the gate TG4 for transmitting an output of the inverter IV4 in response to a pair of clocks CLK and $\overline{CLK}$. Each of the gates TG1 and TG4 is composed of a P-channel transistor $Q_P$ responding to the clock CLK and an N-channel transistor responding to the inverted clock $\overline{CLK}$, while each of the gates TG2 and TG3 is composed of an N-channel transistor $Q_N$ responding to the clock CLK and a P-channel transistor $Q_P$ responding to the inverted clock $\overline{CLK}$. Each of the inverters IV1–IV4 is composed of a P-channel transistor $Q_P$ and an N-channel transistor $Q_N$ connected in series between a higher voltage power supply line $V_{CC}$ and a low voltage power supply line $V_{SS}$.

Figure 6:
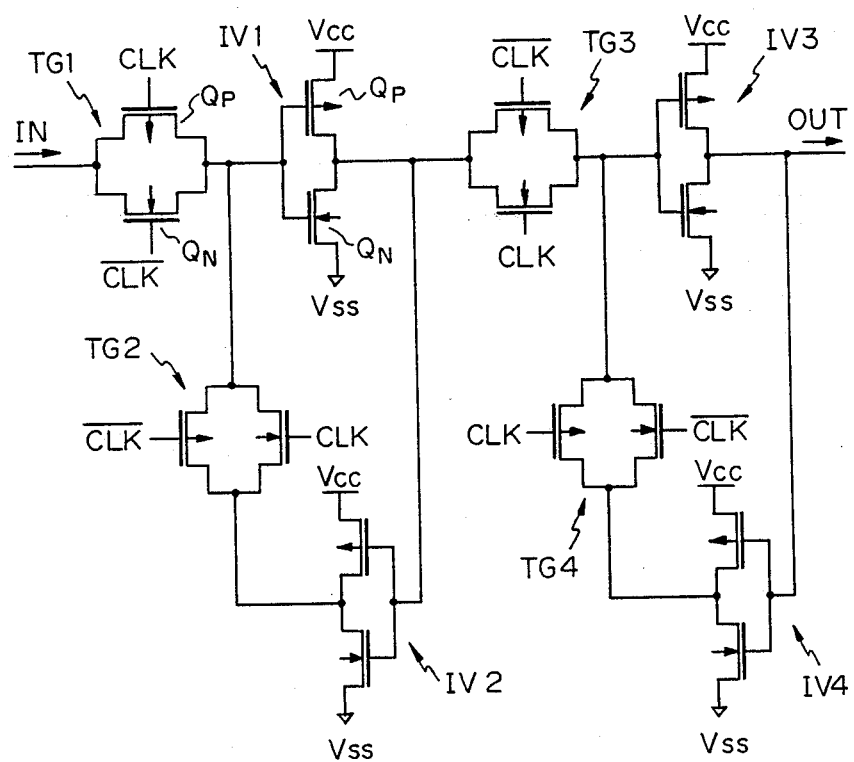
FIG. 6 is a circuit diagram illustrating the constitution of the register shown in FIG. 4.

Also, an inverter for inverting the clock CLK or the inverted clock $\overline{CLK}$ needs to be used, although not shown in FIG. 6. For example, here the register illustrated in FIG. 6 is employed as one of the registers 41, 42 and 43, the inverted clock $\overline{CLK}$ is obtained by applying the clock CLK to the inverter (not shown). For the register 44, the clock CLK is obtained by applying the inverted clock $\overline{CLK}$ to an inverter (not shown).

According to the constitution of FIG. 6, when the clock CLK is made "L" level, the input signal IN is introduced via the gate TG1 and the inverter IV1 into the inverter IV2 and latched therein. Namely, the input signal IN appears at the output end of the inverter IV2. When the clock CLK is made "H" level, the gate TG1 is brought to the closed state and the gates TG2, TG3 are brought to the open state. As a result, the latched signal is output via the gate TG2, the inverter IV1, the gate TG3 and the inverter IV3. Therefore, each of the registers 41, 42, and 43 latch the corresponding input signal in response to the clock CLK of "L" level, and outputs the latched signal in response to the clock $\overline{CLK}$ of "H" level. Contrary to this, the register 44 latches the write data $D_{IN}$ in response to the inverted clock $\overline{CLK}$ of "H" level, and outputs the latched data in response to the inverted clock $\overline{CLK}$ of "L" level.

Next, a concrete circuit constitution of the data I/O portion shown in FIG. 4 will be explained with reference to FIG. 7. Note, for simplification of the explanation, the illustration of FIG. 7 shows only the constitution corresponding to one column of the memory cell array.

Figure 7:
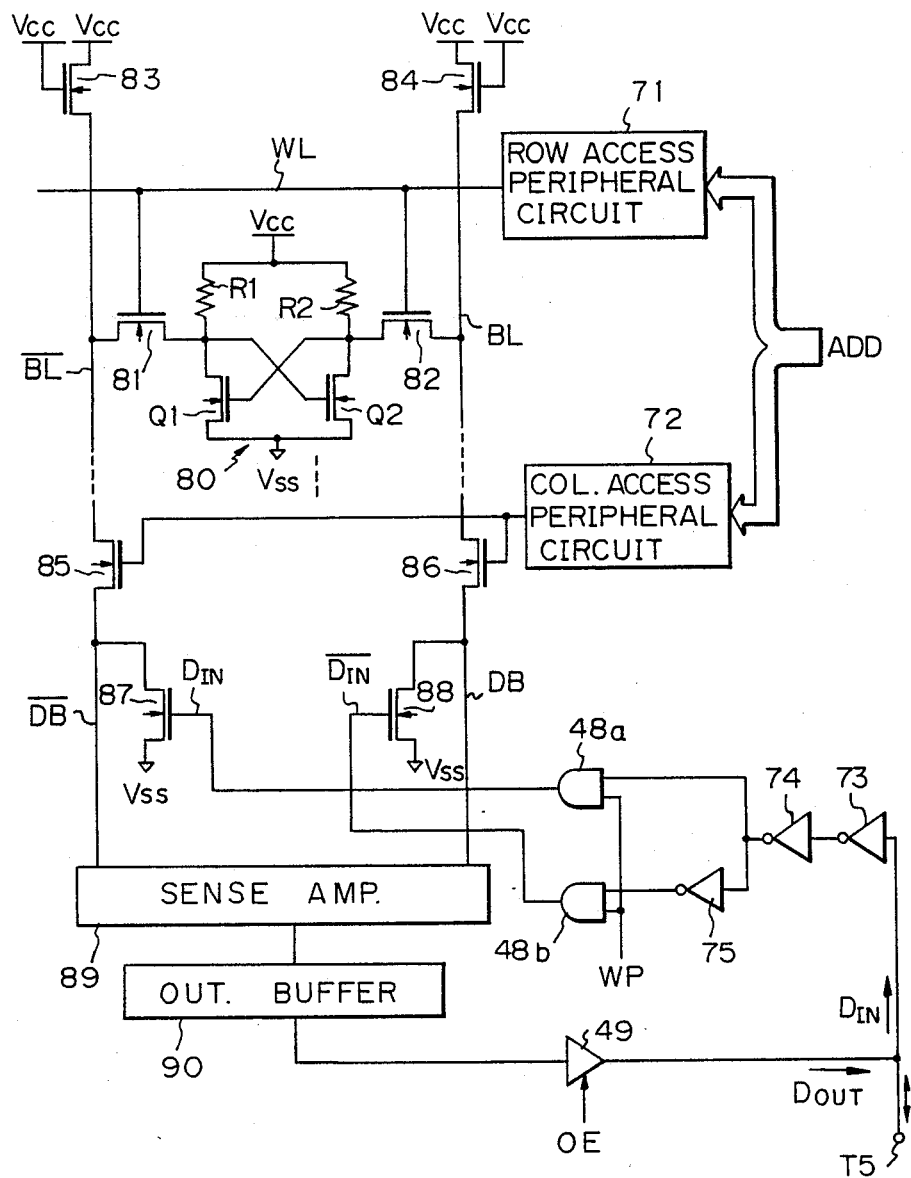
FIG. 7 is a circuit diagram illustrating the concrete constitution of the data input/output portion shown in FIG. 4.
Figure 8:
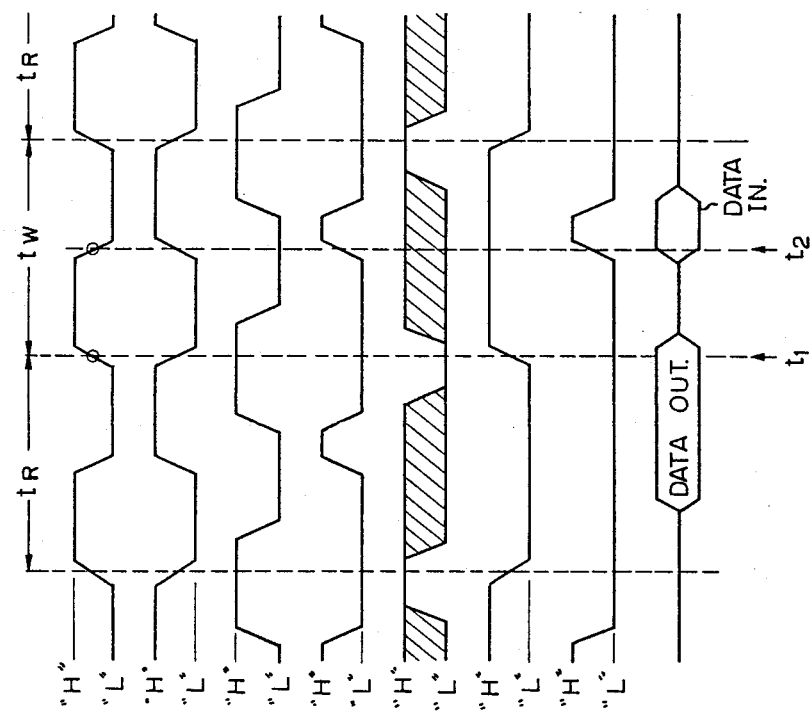
FIGS. 8a to 8h are timing charts for explaining the operation of the device shown in FIG. 4.

In FIG. 7, reference 71 denotes a row access peripheral circuit for selecting one of the word lines WL in response to the address signal ADD; reference 72 denotes a column access peripheral circuit for selecting one of the pairs of bit lines BL, $\overline{BL}$ in response to the address signal ADD; reference 80 denotes a memory cell having a flip-flop structure comprising two drive transistors Q1, Q2 and two load registers R1, R2; references 81 and 82 denote transfer gate transistors for effecting a data read or data write between the corresponding bit line BL, $\overline{BL}$ and the memory cell 80 when the corresponding word line WL is selected; references 83 and 84 denote transistors functioning as loads of the bit lines $\overline{BL}$, BL; and references 85 and 86 denote transistors for connecting the bit line $\overline{BL}$ and the data line $\overline{DB}$, the bit line BL and the data line DB, respectively, under the control from the column access peripheral circuit 72.

Also, transistors 87 and 88 are connected to the data lines DB and $\overline{DB}$, respectively, which are turned ON in the data write operation. In this case, the write data $D_{IN}$ input from the I/O terminal T5 is fed via an inverter 73, an inverter 74, and an AND gate 48a to the gate of the transistor 87 (gate signal $D_{IN}$), while the write data $D_{IN}$ input from the I/O terminal T5 is fed via the inverter 73, the inverter 74, an inverter 75, and an AND gate 48b to the gate of the transistor 88 (gate signal $\overline{D_{IN}}$). Note, the AND gates 48a, 48b are controlled by the write pulse WP. The date on the data lines $\overline{DB}$ and DB are amplified through a sense amplifier 89 and, via an output buffer 90 and the tristate buffer 49, output to the I/O terminal T5 as the read data $D_{OUT}$.

Next, the operation of the STRAM device shown in FIGS. 4 to 7 will be described with reference to the timing charts shown in FIGS. 8a to 8h.

First, a chip select signal $\overline{CS}$ of "L" level is applied to the terminal T2. In this state, when the write enable signal $\overline{WE}$ is applied to the terminal T3 and the clock CLK is applied to the terminal T4, a read cycle $t_R$ or a write cycle $t_W$ is defined in synchronization with the rising edge of the clock CLK.

(1) Read Cycle $t_R$

When the write enable signal $\overline{WE}$ is made "H" level and the clock CLK is made "H" level, the output signal OE of the AND gate 45 is raised to "H" level. As a result the buffer 49 functions, so that the read operation is started. However, the data output becomes valid a short time after the rise of the clock CLK due to a delay in the circuit in the read operation (see FIG. 8h).

Also, the state of the data output still continues at the end of the read cycle $t_R$, i.e., at the beginning of the write cycle $t_W$ (at the time of $t_1$), due to small delay in the circuit operation. At this time, the data read from the memory cell array 40 is output via the column decoder and I/O gate 40b and the buffer 49 to the I/O terminal T5, and output to the outside. Namely, the I/O terminal T5 can be exclusively utilized as "an output terminal".

(2) Write Cycle $t_W$

When the write enable signal $\overline{WE}$ is at "L" level and the clock CLK is made "H" level, the output signal WS of the AND gate 46 is raised to "H" level. However, since the inverted clock $\overline{CLK}$ is at "L" level, the write pulse generating circuit 47 cannot generate the write pulse WP of "H" level. As a result, the buffer 48 does not function, so that the write operation is not yet started.

Then, when a sufficient time for the termination of the above state of the data output elapses and the clock $\overline{CLK}$ is at "L" level at the time of $t_2$, the inverted clock CLK is raised to "H" level. At this time, the register 44 latches the write data $D_{IN}$ input from the I/O terminal T5, while the write pulse generating circuit 47 generates a write pulse WP of "H" level. As a result, the buffer 48 functions, so that the write data $D_{IN}$ latched in the register 44 is fed via the buffer 48 and the column decoder and I/O gate 40b to the memory cell array 40. Namely, the data input becomes valid, as shown in FIG. 8h. At this time, i.e., at the time of $t_2$, since the state of the data output is fully terminated, the I/O terminal T5 can be exclusively utilized as "an input terminal".

As explained above, the STRAM device of the first embodiment is constituted such that, utilizing both the rising edge of the external clock CLK and the falling edge thereof, the timing (time of $t_2$) at which the write data $D_{IN}$ is latched is different from the timing (time of $t_1$) at which the write enable signal $\overline{WE}$ is latched. Therefore, it becomes possible to completely eliminate the disadvantage in which the output data and the input data collide with each other, in spite of the use of the terminal T5 common to the input and output of data. Namely, the scale of the whole circuit as a device can be reduced by making the input terminal and the output terminal common to each other.

Although, in the above first embodiment, the write enable signal $\overline{WE}$ is latched at the rising edge of the clock CLK and the write data $D_{IN}$ is latched at the falling edge thereof, each may be latched at the inverse edge, respectively.

Figure 9:
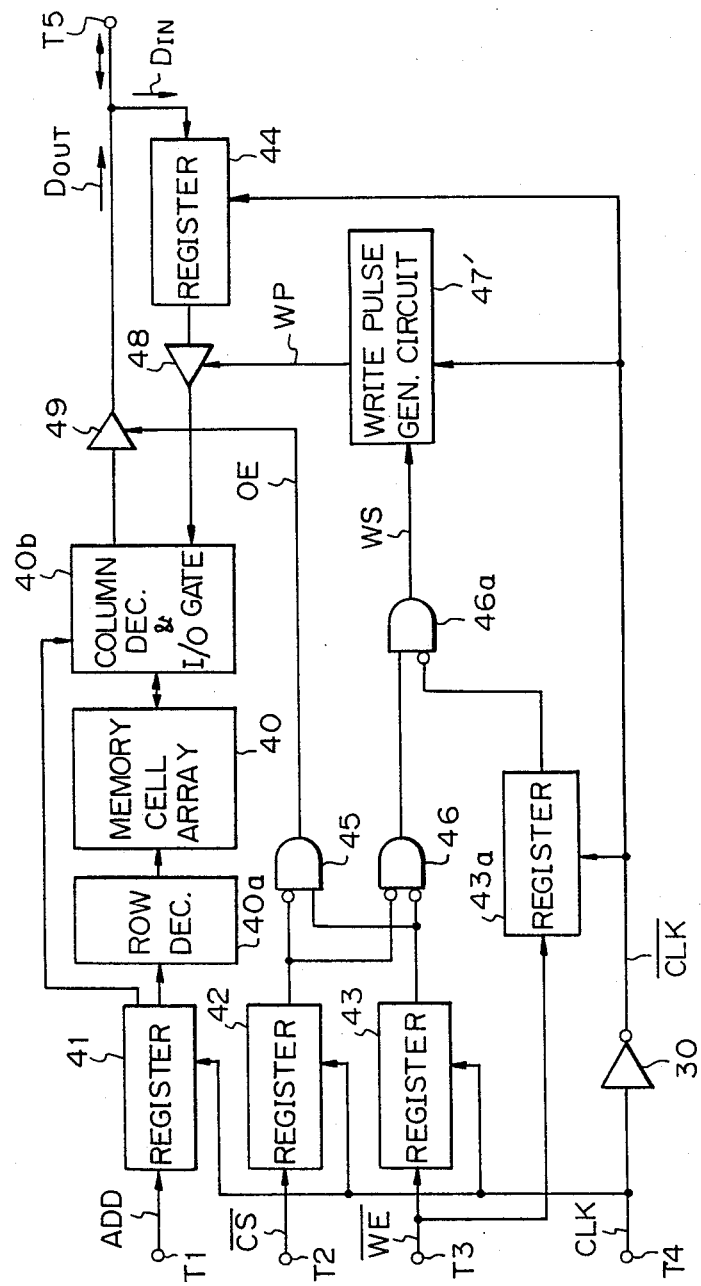
FIG. 9 is a block diagram illustrating the constitution of a second embodiment of the present invention.

FIG. 9 illustrates the constitution of a STRAM device as a second embodiment of the present invention.

The constitution of FIG. 9 is different from that of FIG. 4 in that a different write pulse generating circuit 47' is provided in place of the write pulse generating circuit 47, and that an AND gate 46a and a register 43a are newly added. The register 43a, connected between the terminal T3 and the AND gate 46a, has a function of latching the write enable signal $\overline{WE}$ in response to the inverted clock $\overline{CLK}$ of "H" level, and outputting the latched signal in response to the inverted clock $\overline{CLK}$ of "L" level. Namely, the register 43a has the same constitution as the register 44. The AND gate 46a responds to the output of the AND gate 46 and an inverted signal of an output of the register 43a, and outputs the write control signal WS to the write pulse generating circuit 47'. The other constitution and the operation thereof are the same as those of FIG. 4, and thus, the explanation thereof will be omitted. Also, referring to FIG. 10, the constitution of the write pulse generating circuit 47' is the same as that of the circuit 47 of FIG. 5, except that a delay circuit 55 is provided which delays the inverted clock $\overline{CLK}$ by a predetermined time, having a smaller amount of delay than the delay circuit 51, and outputs the delayed clock to the AND gate 53 as a signal S3.

Figure 10:
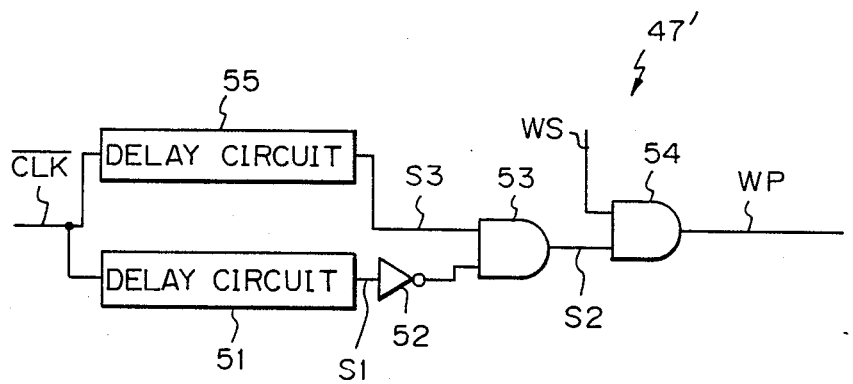
FIG. 10 is a circuit diagram illustrating the constitution of the write pulse generating circuit shown in FIG. 9.

Next, the operation of the STRAM device shown in FIGS. 9 and 10 will be described with reference to the timing charts shown in FIGS. 11a to 11i.

First, the chip select signal $\overline{CS}$ of "L" level is applied to the terminal T2. In this state, when the write enable signal $\overline{WE}$ is applied to the terminal T3 and the clock CLK is applied to the terminal T4, a cycle for carrying out a predetermined function (in the illustrated example, a write cycle $t_W$ and a write cancel cycle $t_{WC}$) is defined in synchronization with the rising edge of the clock CLK.

(1) Write Cycle $t_W$

When the write enable signal $\overline{WE}$ is made "L" level at a time of $t_1$ and the clock CLK is made "H" level, the write enable signal $\overline{WE}$ is input via the register 43 and the AND gate 46 to the AND gate 46a.

Next, when the write enable signal $\overline{WE}$ is made "L" level at a time of $t_2$ and the clock CLK is made "L" level, i.e., the inverted clock $\overline{CLK}$ is made "H" level, the write enable signal $\overline{WE}$ is input via the register 43a to the AND gate 46a. As a result, the write control signal WS of "H" level is output from the AND gate 46a and the write pulse generating circuit 47' generates a write pulse WP of "H" level in response to the signal WS and the inverted clock $\overline{CLK}$.

On the other hand, the write data $D_{IN}$ is latched in the register 44 at the rise of the inverted clock $\overline{CLK}$, i.e, at the time of $t_2$. When the write pulse WP of "H" level is output, the buffer 48 functions, so that the data latched in the register 44 is fed via the buffer 48 and the column decoder and I/O gate 40b to the memory cell array 40. Namely, the write operation of data is carried out (see FIG. 11i).

(2) Write Cancel Cycle $t_{WC}$

When the write enable signal $\overline{WE}$ is made "L" level at a time of $t_3$ and the clock CLK is made "H" level, the write enable signal WE is input via the register 43 and the AND gate 46 to the AND gate 46a.

Next, when the write enable signal $\overline{WE}$ is made "H" level at a time of $t_4$ and the inverted clock $\overline{CLK}$ is made "H" level, the write enable signal $\overline{WE}$ is input via the register 43a to the AND gate 46a. In this case, however, since the signal $\overline{WE}$ is at "H" level, the AND gate 46a is brought to "a closed state". As a result, the write control signal WS is lowered to "L" level, so that the write pulse generating circuit 47' cannot generate the write pulse WP of "H" level (see FIG. 11h).

Therefore, since the buffer 48 does not function, the write data $D_{IN}$ latched in the register 44 at the rise of the inverted clock $\overline{CLK}$, i.e., at the time of $t_4$, is not transmitted to the memory cell array 40. Namely, the data write operation is cancelled (see FIGS. 11h and 11i).

Figure 12:
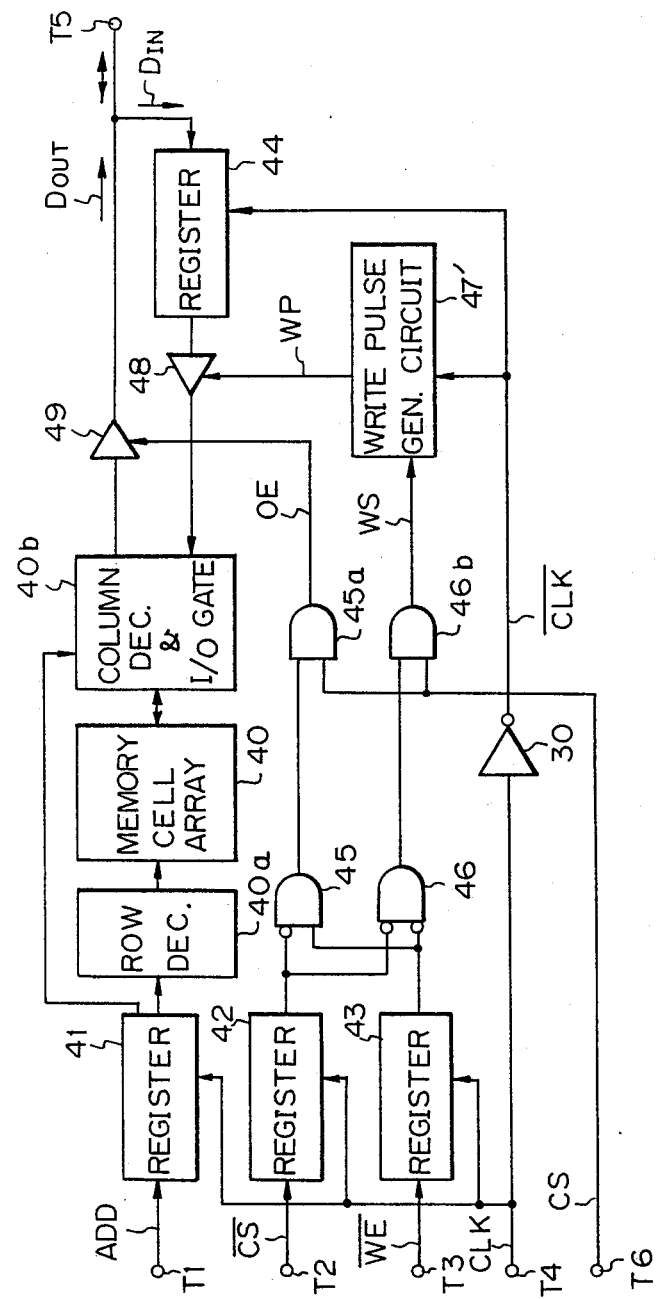
FIG. 12 is a block diagram illustrating the constitution of a third embodiment of the present invention.
Figure 13:
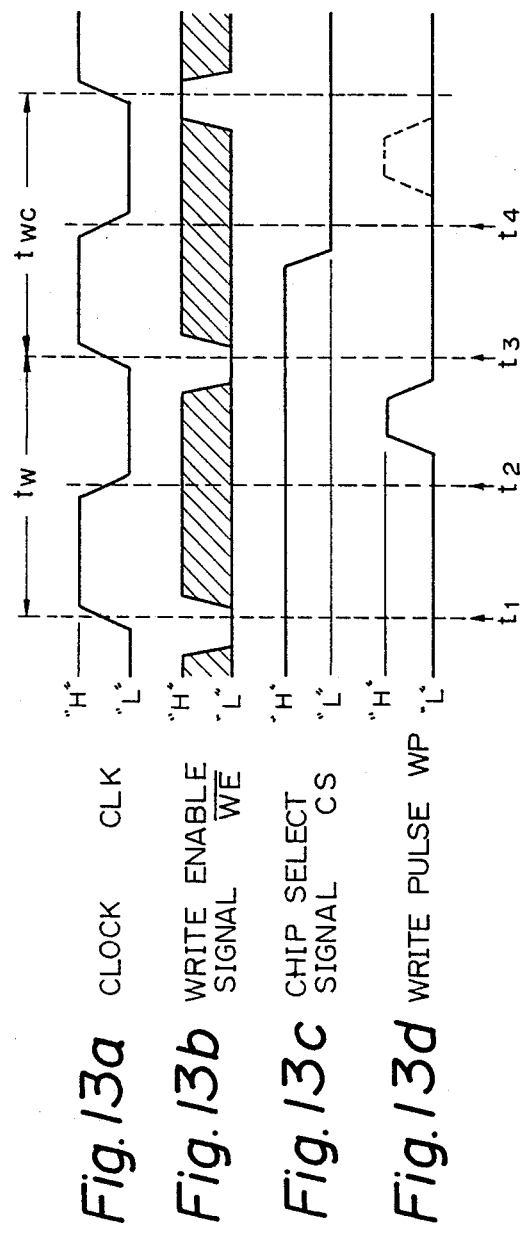
FIGS. 13a to 13d are timing charts for explaining the operation of the device shown in FIG. 12.

FIG. 12 illustrates the constitution of a STRAM device as a third embodiment of the present invention.

The constitution of FIG. 12 is different from that of FIG. 9 in that two AND gates 45a, 46b are provided in place of the register 43a and the AND gate 46a, and that a terminal T6 for receiving an asynchronous chip select signal CS irrelevant to the external clock CLK is newly added. The AND gate 45a responds to the asynchronous chip select signal CS and the output of the AND gate 45 and outputs the read control signal OE, while the AND gate 46b responds to the asynchronous chip select signal CS and the output of the AND gate 46 and outputs the write control signal WS. The other constitution and the operation thereof are the same as those of FIG. 9, and thus, the explanation thereof will be omitted. In the embodiment of FIG. 12, the asynchronous chip select signal CS is employed as a control signal for the write cancel.

FIGS. 13a to 13d illustrate timing charts representing the operation of the device shown in FIG. 12.

As shown in FIGS. 13a to 13d, a write pulse WP is generated in response to the falling edge (time of $t_2$) of the clock CLK in the write cycle $t_W$, and accordingly, a write operation is carried out. In the next cycle, i.e, the write cancel cycle $t_{WC}$, however, when the asynchronous chip select signal CS is made "L" level before the fall (time of $t_4$) of the clock CLK, the result, the output of the write control signal WS of "H" level is hindered. Therefore, since a write pulse generating circuit 47' cannot generate the write pulse WP of "H" level, the buffer 48 does not function, and the write operation is cancelled.

As explained above, the STRAM devices of the second embodiment (FIG. 9) and the third embodiment (FIG. 12) are constituted such that the write enable signal $\overline{WE}$ is latched in response to the rising edge of the external clock, and that the control of whether the write pulse WP is generated or the generation thereof is prevented is carried out in response to the falling edge of the clock CLK based on the logical level of the predetermined control signal (signal $\overline{WE}$ in the second embodiment, and signal CS in the third embodiment). Therefore, it becomes possible to cancel the write operation, when necessary, with respect to a cell even if an address access to the cell is carried out. This contributes to preventing a write access to a wrong cell from being carried out.

Although, in the second and third embodiments, the write enable signal $\overline{WE}$ is latched at the rising edge of the clock CLK, and the generation of a write pulse WP or a write cancel is carried out immediately after the falling edge of the clock CLK, each may be carried out in response to the inverse edge, respectively.

Figure 14:
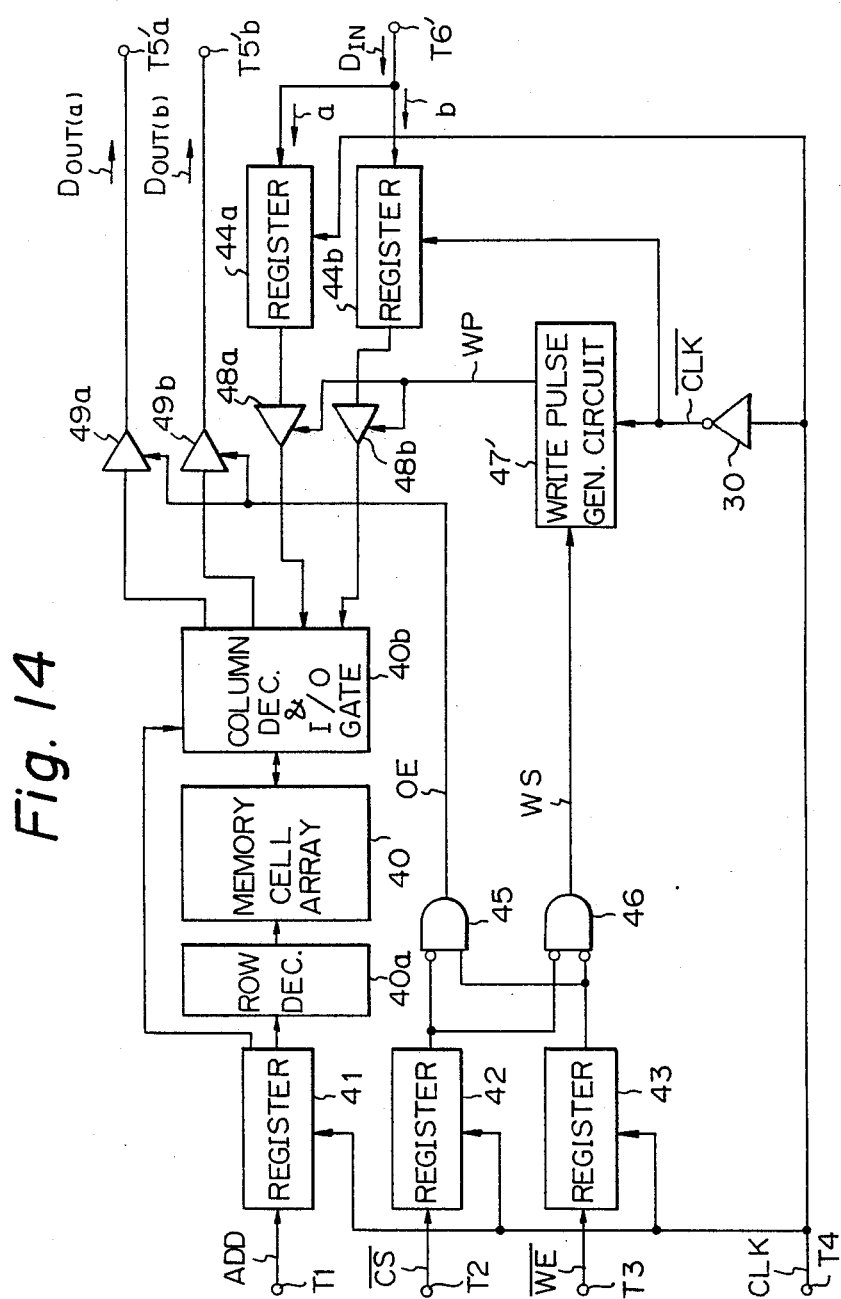
FIG. 14 is a block diagram illustrating the constitution of a fourth embodiment of the present invention.

FIG. 14 illustrates a constitution of the STRAM device as a fourth embodiment of the present invention, and FIGS. 15a to 15k, show timing charts representing the operation of the device.

The constitution of FIG. 14 is different from that of FIG. 4 in that: the portion between the column decoder and I/O gate 40b and the date output end is separated into two paths, and two buffers 49a, 49b and the corresponding output terminals T5a', T5b' are provided; the portion between the column decoder and I/O gate 40b and the data input end is separated into two paths, and two buffers 48a, 48b, two registers 44a, 44b, and a single input terminal T6' are provided; and a write pulse generating circuit 47' is provided in place of the write pulse generating circuit 47. In this case, the register 44a carries out the same operation as that of the registers 41–43 of FIG. 4, while the register 44b carries out the same operation as that of the register 44. The other constitution and the operation thereof are the same as those of FIG. 4, and thus, the explanation thereof will be omitted.

Next, the operation of the STRAM device shown in FIG. 14 will be described with reference to the timing charts shown in FIGS. 15a to 15k.

First, a chip select signal $\overline{CS}$ of "L" level is applied to the terminal T2. In this state, when the write enable signal $\overline{WE}$ of "L" level is applied to the terminal T3 and the clock CLK is applied to the terminal T4, a write cycle $t_W$ is defined in synchronization with the rising edge of the clock CLK.

When the clock CLK is made "H" level at the beginning (time of $t_1$) of the write cycle $t_W$, the output signal WS of the AND gate 46 is raised to "H" level. On the other hand, data a is taken into the register 44a as the write data $D_{IN}$ from the terminal T6' at the rise of the clock CLK. Namely, the register 44a becomes "valid" (see FIG. 15f).

Next, the inverted clock $\overline{CLK}$ is made "H" level at a time of $t_2$, data b is taken into the register 44b as the write data $D_{IN}$ from the terminal T6'. Namely, the register 44b becomes "valid" (see FIG. 15g). Also, the write pulse generating circuit 47' generates a write pulse WP of "H" level in response to the inverted clock $\overline{CLK}$ of "H" level based on the write control signal WS of "H" level.

When the "H" level write pulse WP is generated, both the buffer 48a and the buffer 48b function, so that the data "a" and "b" latched in the registers 44a and 44b, respectively, are fed via the corresponding buffer and the column decoder and I/O gate 40b to the memory cell array 40. Namely, at this time, both data "a" and data "b" are simultaneously written into the memory cell array.

As explained above, the STRAM device of the fourth embodiment is constituted such that, utilizing both the rise of the clock CLK and that of the inverted clock $\overline{\text{CLK}}$, two kinds of data "a" and "b" can be input from the single terminal T6, in a time sharing mode. Therefore, it becomes possible to reduce the number of data input terminals by half. This contributes to reducing the space occupied by the input terminals on the chip, and accordingly, the scale of the whole circuit as a device can be decreased.

Although, in the above-fourth embodiment, the write data "a" is latched at the rising edge of the clock CLK and the write data "b" is latched at the falling edge thereof, each may be latched at the inverse edge, respectively.

Although the present invention has been disclosed and described by way of several embodiments, it will be apparent to those skilled in the art that other embodiments and modifications of the present invention are possible without departing from the spirit or essential features thereof.

We claim:

1. A semiconductor memory device receiving an external clock having a rising edge and a falling edge comprising:
    a memory cell array,
    a first latch circuit operatively connected to said memory cell array, for receiving a control signal designating one of a read cycle and a write cycle for said memory cell array, said first latch circuit latching said control signal in response to one of the rising edge and the falling edge of said external clock;
    a second latch circuit operatively connected to said memory cell array, for receiving a write data, said second latch circuit latching said write data in response to another of the rising edge and the falling edge of said external clock; and
    a write signal generating circuit operatively connected to said memory cell array and said first latch circuit, for feeding a write signal to said memory cell array when said control signal latched in said first latch circuit designates said write cycle.

2. A device as set forth in claim 1, wherein said write signal generating circuit receives a write control signal designating a cancellation of a write operation at said another of the rising edge and the falling edge of said external clock and stops feeding said write signal to said memory cell array.

3. A semiconductor memory device comprising:
    a cycle defining circuit for defining a read cycle and a write cycle in response to an external clock and an external write enable signal and outputting a read control signal or a write control signal based on a certain kind of defined cycle;
    means for inverting said clock to an inverted clock;
    a write signal generating circuit operatively connected to said cycle defining circuit, for generating a write signal in response to said inverted clock when said write control signal is output;
    a memory cell array in which a read access or write access of data is carried out based on said read control signal or said write signal; and
    a latch circuit operatively connected to said write signal generating circuit, for latching a write data and transmitting said write data to said memory cell array in response to said inverted clock and said write signal, whereby said write enable signal is latched at a change in level of said external clock in said write cycle and said write data is latched at a reverse change in level thereof.

4. A device as set forth in claim 3, wherein said cycle defining circuit includes a first register for latching and outputting said write enable signal in response to said external clock and a gate circuit for outputting said read control signal or said write control signal in accordance with a logical level of said write enable signal in a selected state of said device.

5. A device as set forth in claim 4, wherein said first register latches said write enable signal at a fall of said external clock and outputs said write enable signal at a rise thereof.

6. A device as set forth in claim 4, wherein said latch circuit includes a second register for latching and outputting said write data in response to said inverted clock and a buffer for transmitting said write data to said memory cell array in response to said write signal.

7. A device as set forth in claim 6, wherein said second register latches said write data at a rise of said inverted clock and outputs said write data at a fall thereof.

8. A semiconductor memory device comprising:
    a cycle defining circuit for defining a cycle for carrying out a predetermined function in response to an external clock and an external write enable signal and outputting a write control signal in response to an external control signal in the defined cycle;
    means for inverting said clock to an inverted clock;
    a write signal generating circuit operatively connected to said cycle defining circuit, for generating a write signal in response to said inverted clock when said write control signal is output; and
    a memory cell array in which a write access of data is carried out based on said write signal, whereby said write enable signal is latched at a change in level of said external clock in said defined cycle, and a control of a generation of said write signal or a prohibition of said generation is carried out at a reverse change in level of said external clock in accordance with a logical level of said external control signal.

9. A device as set forth in claim 8, wherein said external control signal is identical to said write enable signal.

10. A device as set forth in claim 9, wherein said cycle defining circuit includes a first register for latching and outputting said write enable signal in response to said external clock, a second register for latching and outputting said write enable signal in response to said inverted clock, and a gate circuit for effecting a generation of said write control signal or a prohibition of said generation in accordance with a logical level of said write enable signal in a selected state of said device.

11. A device as set forth in claim 10, wherein said first register latches said write enable signal at a fall of said external clock and outputs said write enable signal at a rise thereof, and said second register latches said write enable signal at a rise of said inverted clock and outputs said write enable signal at a fall thereof.

12. A device as set forth in claim 10, further comprising a third register for latching and outputting said write data in response to said inverted clock and a buffer for transmitting said write data to said memory cell array in response to said write signal.

13. A device as set forth in claim 12, wherein said third register latches said write data at a rise of said inverted clock and outputs said write data at a fall thereof.

14. A device as set forth in claim 8, wherein said external control signal is an asynchronous chip select signal irrelevant to said external clock.

15. A device as set forth in claim 14, wherein said cycle defining circuit includes a first register for latching and outputting said write enable signal in response to said external clock and a gate circuit for effecting a generation of said write control signal or a prohibition of said generation in accordance with a logical level of said write enable signal in a selected state of said device.

16. A device as set forth in claim 15, wherein said first register latches said write enable signal at a fall of said external clock and outputs said write enable signal at a rise thereof.

17. A device as set forth in claim 15, further comprising a second register for latching and outputting said write data in response to said inverted clock and a buffer for transmitting said write data to said memory cell array in response to said write signal.

18. A device as set forth in claim 17, wherein said second register latches said write data at a rise of said inverted clock and outputs said write data at a fall thereof.

19. A semiconductor memory device comprising:
a cycle defining circuit for defining a cycle for carrying out a predetermined function in response to an external clock and an external write enable signal, and outputting a write control signal based on a logical level of said write enable signal at the beginning of the defined cycle;
means for inverting said clock to an inverted clock;
a write signal generating circuit operatively connected to said cycle defining circuit, for generating a write signal in response to said inverted clock when said write control signal is output;
a memory cell array in which a write access of data is carried out based on said write signal; and
a latch circuit operatively connected to said write signal generating circuit, for latching a write data in response to either said external clock or said inverted clock and transmitting said write data to said memory cell array in response to said write signal, said write data being composed of a plurality of data and input in a time sharing mode, whereby a first half of said plurality of data is latched at a change in level of said external clock in said defined cycle and a second half thereof is latched at a reverse change in level thereof, and said plurality of data are simultaneously written in said memory cell array.

20. A device as set forth in claim 19, wherein said cycle defining circuit includes a first register for latching said write enable signal at a fall of said external clock and outputting said write enable signal at a rise thereof, and a gate circuit for outputting said write control signal when said write enable signal is at a predetermined logical level in a selected state of said device.

21. A device as set forth in claim 20, wherein said latch circuit comprises a pair of registers for latching and outputting said write data in response to said external clock and said inverted clock, respectively, and a corresponding pair of buffers for transmitting said write data to said memory cell array in response to said write signal.

22. A device as set forth in claim 21, wherein one of said pair of registers latches said write data at a fall of said external clock and outputs said write data at a rise thereof, and another register latches said write data at a rise of said inverted clock and outputs said write data at a fall thereof.

* * * * *

UNITED STATES PATENT AND TRADEMARK OFFICE
CERTIFICATE OF CORRECTION

PATENT NO. : 4,916,670
DATED : April 10, 1990
INVENTOR(S) : ATSUSHI SUZUKI ET AL.

It is certified that error appears in the above-identified patent and that said Letters Patent is hereby corrected as shown below:

Col. 5, line 24, "WE" should be --$\overline{\text{WE}}$--.

Signed and Sealed this

First Day of October, 1991

Attest:

HARRY F. MANBECK, JR.

Attesting Officer     Commissioner of Patents and Trademarks